United States Patent
Tiehan (10) Patent No.: US 10,269,719 B2
(45) Date of Patent: Apr. 23, 2019

(54) MULTILEVEL LIGHT EMITTING LED SUBSTRATE, PACKAGE AND BULB

(71) Applicant: Ge Tiehan, Hangzhou (CN)

(72) Inventor: Ge Tiehan, Hangzhou (CN)

( * ) Notice: Subject to any disclaimer, the term of this patent is extended or adjusted under 35 U.S.C. 154(b) by 0 days.

(21) Appl. No.: 15/757,713

(22) PCT Filed: Sep. 7, 2016

(86) PCT No.: PCT/CN2016/098299
§ 371 (c)(1),
(2) Date: Mar. 6, 2018

(87) PCT Pub. No.: WO2017/041709
PCT Pub. Date: Mar. 16, 2017

(65) Prior Publication Data
US 2018/0337132 A1    Nov. 22, 2018

(30) Foreign Application Priority Data

Sep. 11, 2015  (CN) .................... 2015 2 0701064 U
Sep. 11, 2015  (CN) .................... 2015 2 0701453 U
Sep. 11, 2015  (CN) .................... 2015 2 0703575 U (51) Int. Cl.
*F21K 9/20*    (2016.01)
*F21K 9/232*    (2016.01)
(Continued)

(52) U.S. Cl.
CPC ............ *H01L 23/5386* (2013.01); *F21K 9/20* (2016.08); *F21K 9/232* (2016.08); *F21K 9/235* (2016.08); *F21K 9/238* (2016.08); *H01L 23/5385* (2013.01); *H01L 23/5387* (2013.01); *H01L 25/0753* (2013.01); *F21Y 2107/40* (2016.08); *F21Y 2107/50* (2016.08); *F21Y 2115/10* (2016.08); *H01L 33/62* (2013.01); *H01L 33/64* (2013.01); *H01L 2224/48137* (2013.01); *H01L 2224/8592* (2013.01); *H01L 2924/15151* (2013.01); *H01L 2924/15162* (2013.01)

(58) Field of Classification Search
CPC ............ H01L 23/5385; H01L 23/5386; H01L 23/5387; H01L 25/0753; H01L 3/62; F21K 9/232; F21K 9/235; F21K 9/238
See application file for complete search history.

(56) References Cited

FOREIGN PATENT DOCUMENTS

| CN | 203463969 U | 3/2014 |
|----|-------------|--------|
| CN | 203656627 U | 6/2014 |

(Continued)

*Primary Examiner* — Thomas M Sember
(74) *Attorney, Agent, or Firm* — Getech Law LLC; Jun Ye (57) ABSTRACT

A multilevel light emitting LED substrate and package, and bulb, comprising multiple annular substrates disposed at intervals, wherein every two adjacent annular substrates among the multiple annular substrates are connected by using at least one connection part, and the the connection part is stretched and shaped such that the multiple annular substrates are located in different planes to form a three-dimensional structure, By means of the multilevel light emitting LED substrate and package, and the bulb, a planar LED substrate and package can be processed to be a three-dimensional structure; the process is convenient, the structure is simple, and it is easy to set and control LED chips; moreover, the process efficiency is high, so that the LED package is not easily damaged in the process, and the production efficiency and yield are improved.

10 Claims, 7 Drawing Sheets

(51) Int. Cl.
*F21K 9/235* (2016.01)
*F21K 9/238* (2016.01)
*H01L 33/62* (2010.01)
*H01L 33/64* (2010.01)
*H01L 23/538* (2006.01)
*H01L 25/075* (2006.01)
*F21Y 115/10* (2016.01)
*F21Y 107/50* (2016.01)
*F21Y 107/40* (2016.01)

(56) References Cited

FOREIGN PATENT DOCUMENTS

| | | |
|---|---|---|
| CN | 204176377 U | 2/2015 |
| CN | 105098050 A | 11/2015 |
| CN | 204927353 U | 12/2015 |
| CN | 205001877 U | 1/2016 |
| CN | 205001884 U | 1/2016 |
| CN | 205065341 U | 3/2016 |

Fig. 13

MULTILEVEL LIGHT EMITTING LED SUBSTRATE, PACKAGE AND BULB

TECHNICAL FIELD

The present invention relates to an LED light emitting device.

BACKGROUND

In the prior art, there are different LED packaging methods, including LED lamp package, Chip On Board LED package, Surface Mount Device LED package, System In Package LED package, etc., and different packaging substrate will be selected based on the LED packaging method.

In general, the substrate for the Chip On Board LED package is a substrate which is a circuit board or made of a single material, such as metal, PVC, Polymethyl methacrylate, plastic, etc., and the shape of the substrate is mostly a flat rectangle, a flat circular or flat strip, etc., and the edge of the substrate is usually smooth curve or straight line.

In addition, after the LED chips are disposed on the existing substrate and sealed with fluorescent glue, a planar light will be emitted. Even if a plurality of substrates are arranged to be a luminous body with three-dimensional shape, an uneven light emission often appear around the luminous body due to imperfect overall structure design. Furthermore, when the substrate is made of a light transparent material, the luminous body can emit light at a range of 360 degrees, but in this case, a problem of heat dissipation would arise. When the substrate is made of a non-transparent material, such as a metal, the side of the substrate that is not provided with the LED chip will not emit light such that the luminous body cannot emit light at 360-degree.

In conclusion, the existing Chip On Board LED package and bulb have not a full light emitting angle to achieve a multi-angle and multilevel light emitting, and are also prone to meeting the dissipation problem and affecting the luminous efficiency.

SUMMARY OF THE INVENTION

The technical problem to be solved by the present invention is to provide a chip-on-board LED packaging substrate, LED package and LED light bulb with uniform light emission, large light emitting angle, multilevel light emission and excellent heat dissipation effect.

The technical solution adopted by the present invention to solve the above technical problem is to provide A multilevel light emitting LED substrate, which comprises a plurality of annular substrates spaced apart from each other, characterized in that, every two adjacent annular substrates among the plurality of annular substrates are connected with each other by using at least one connection part, the plurality of annular substrates are located in different planes to form a three-dimensional structure by stretching and reshaping the connection part.

Preferably, there is one connection part between every two adjacent annular substrates, and the connection parts are connected with each other and the positions thereof correspond to each other.

In order to facilitate the control and arrangement of the LED chips, the plurality of annular substrates is provided with a connecting element such that the annular substrate forms a broken circuit structure.

Preferably, each of the plurality of annular substrates is provided with a disconnected opening.

To facilitate the connection, a connecting element is disposed on the opening, the connecting element comprises an outer material wrapping and connecting two ends of the opening, an inner material located in the outer material and without contacting with two ends of the opening, the outer material is made of non-conductive material and the inner material is made of conductive material, the inner material is electrically connected with the LED chips on the annular substrate by a connecting wire.

Preferably, a connecting member is connected between the inner materials of the connecting elements of each annular substrates.

In order to facilitate stretching and transformation, the connecting member and/or the connection part are/is a bending structure.

Preferably, the annular substrate is a polygonal annular structure, a circular ring structure, or an annular structure composed of several arcs and several straight lines.

Preferably, the connection part connects one end of the openings of two adjacent annular substrates respectively, and the two ends of the opening of each annular substrate are respectively connected with the ends of the openings of two annular substrates adjacent to said annular substrate by means of different connection parts.

Preferably, the plurality of annular substrates are nested with each other, and the plurality of annular substrates are concentrically or eccentrically arranged; or the plurality of annular substrates are arranged next to and separately from each other.

A multilayered light emitting LED package, which comprises said light emitting LED substrate, characterized in that a plurality of LED chips are arranged in series and/or in parallel on the annular substrate.

A multilayered light emitting LED bulb having said multilayered light emitting LED package, characterized in that, comprising an outer transparent shell and a stem disposed in the transparent shell, the stem is provided with a lead wire on which at least one LED package is fixed, an electrical connector is disposed at the bottom of the transparent shell and the bottom of the stem, a driver is disposed in the electrical connector, and the lead wire is connected to the driver.

Compared with the prior art, the invention has the advantages that the multilevel light emitting LED substrate and package, and the bulb, a planar LED substrate and package can be transformed to be a three-dimensional structure; the process is convenient, the structure is simple, and it is easy to set and control the LED chips; moreover, the process efficiency is high, and the LED package is not easily to be damaged in the process, and the production efficiency and yield are improved.

DETAILED DESCRIPTION

The present invention will be further described in detail below with reference to the embodiments and drawings.

Figure 1:
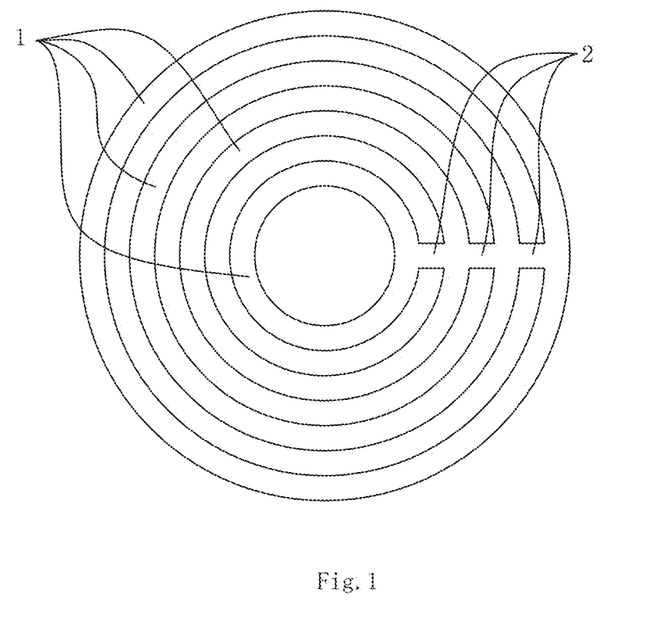
FIG. 1 is a schematic view of an LED substrate and package according to the first embodiment of the present invention.

As illustrated in FIG. 1, the LED substrate of the first embodiment of the present invention, which comprises a plurality of annular substrates 1 spaced apart from each other and concentrically arranged on the same plane, the plurality of annular substrates 1 are circular and spaced apart from each other, and the radii of the plurality of annular substrates 1 are gradually increased, and the spacing between the annular substrates 1 are the same or different. Every two adjacent annular substrates 1 are connected with each other by a connection part 2. As shown in FIG. 1, only one connection part 2 is provided between two adjacent annular substrates, and the plurality of connection parts 2 are integrally connected with each other. A plurality of LED chips are connected in series and/or in parallel on the annular substrate 1. The plurality of LED chips can be electrically connected by connecting wires or electrically connected by circuits reserved on the annular substrate. The LED package is formed by the LED chips and the connecting wires between the LED chips disposed on the LED substrate.

Figure 2:
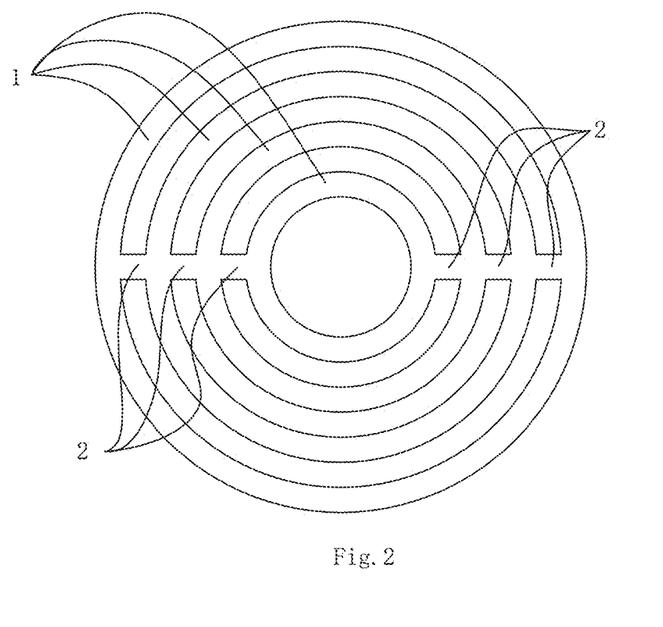
FIG. 2 is a schematic view of an LED substrate and package according to the second embodiment of the present invention.

FIG. 2 illustrates an LED substrate and package of the second embodiment, which also comprises a plurality of annular substrates 1 spaced apart from each other and arranged concentrically, and the connection parts are further provided between the plurality of annular substrates 1. Every two adjacent annular substrates are connected with each other by two connection parts 2, and the two connection parts 2 between the plurality of annular substrates 1 respectively correspond in position.

Figure 3:
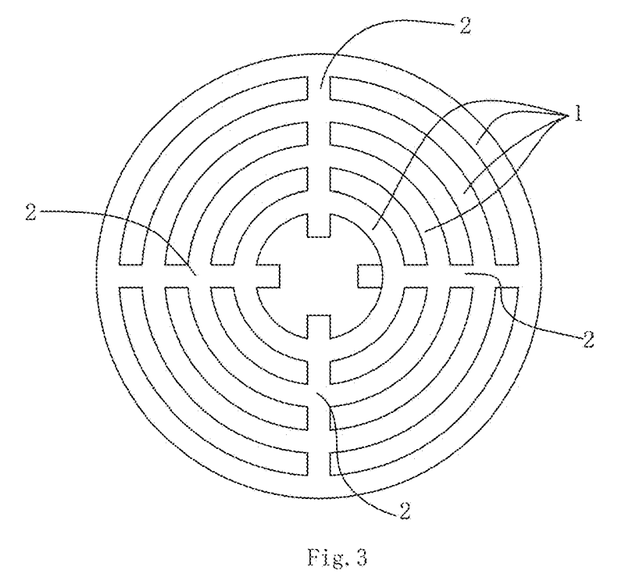
FIG. 3 is a schematic view of an LED substrate and package according to the third embodiment of the present invention.

FIG. 3 illustrates an LED substrate and package of the third embodiment, the LED substrate also comprises a plurality of annular substrates 1 spaced apart from each other and arranged concentrically. Every two adjacent annular substrates 1 are connected with each other by four connection parts 2, and the four connection parts 2 between the plurality of annular substrates 1 respectively correspond in position.

Figure 4:
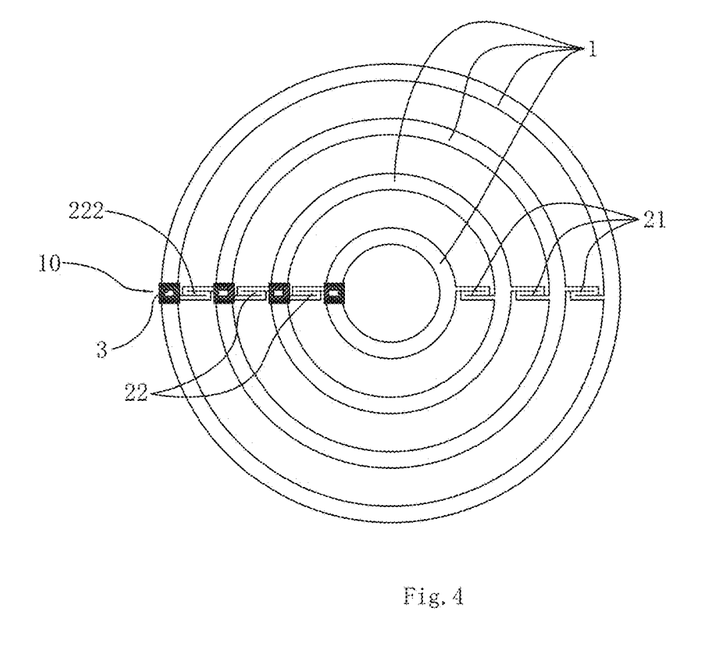
FIG. 4 is a schematic view of an LED substrate and package according to the fourth embodiment of the present invention.

FIG. 4 illustrates an LED substrate and package of the fourth embodiment, the LED substrate also comprises a plurality of annular substrates 1 spaced apart from each other and arranged concentrically, two connection parts 2, i.e. a first connection part 21 and a second connection part 22, are provided between adjacent annular substrates 1. The first connection part 21 is a bending structure, the second connection part 22 includes a connecting element 3 for disconnecting each annular substrate 1 and a connecting member 222 between a plurality of connecting elements 3. The connecting member 222 is a bending structure, such that the connecting member has a smaller area and volume without reshaping and stretching, and has a greater length after reshaping and stretching.

Figure 5:
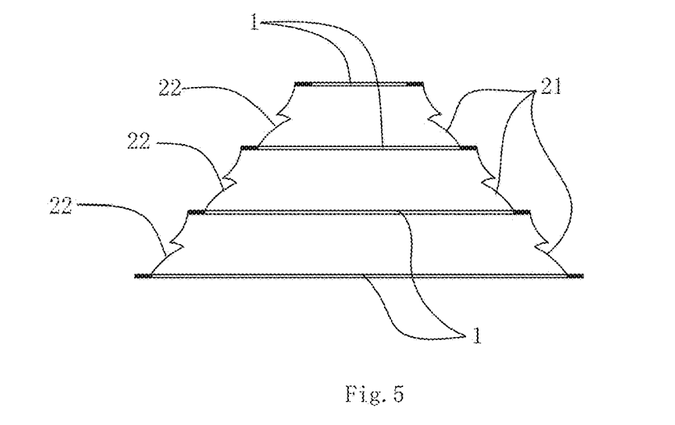
FIG. 5 is a schematic view of the LED substrate and package according to the fourth embodiment of the present invention after stretching.

As shown in FIG. 5, the plurality of annular substrates 1 are sequentially arranged in a three-dimensional structure from top to bottom and at a certain distance, as long as the first connection part 21 and the connecting members 222 between the plurality of connecting members 3 are reshaped. In FIG. 5, each annular substrate is in the same plane, and a plurality of annular substrates 1 are respectively arranged in a plurality of planes parallel to each other. Alternatively, the plurality of annular substrates 1 are respectively located on a plurality of planes which are not parallel or some of which parallel to each other, as long as the annular substrates 1 are respectively located in different planes. By means of such a substrate structure, when the planar substrate is to be fixed to a three-dimensional structure, it is only required to reshape and stretch the connecting member 222 and the first connection part 21. That is, the substrate of three-dimensional structure is formed only by reshaping the connection part, such that the LED chips arranged on the substrate can achieve a multilevel and multi-angle lighting, and will not be easily damaged when reshaping to the three-dimensional structure. This can ensure the processing efficiency and yield of the LED substrate. As shown in FIG. 5, the most medial annular substrate 1 is located at the top and the most lateral annular substrate 1 is located at the bottom. Alternatively, the most medial annular substrate is located at the bottom and the most lateral annular substrate is located at the top. Or the plurality of annular substrates 1 are staggered with each other, that is, the plurality of annular substrates 1 are arranged in a staggered manner in the vertical direction. To achieve such a three-dimensional substrate shape, it is only required to reshape and stretch the connection part 2.

Figure 6:
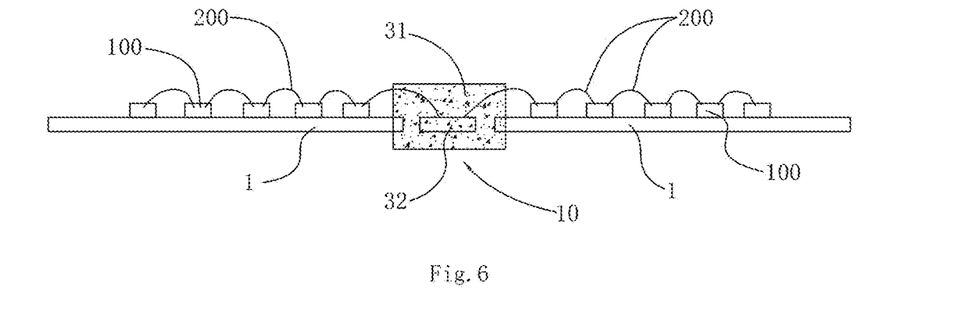
FIG. 6 is a schematic view of a connection between the connecting element on the LED substrate and package according to the fourth embodiment of the present invention and the substrate.

As shown in FIG. 4, each annular substrate 1 has a disconnected opening 10 on which a connecting element 3 is mounted. The connecting element 3 has a configuration as shown in FIG. 6 and comprises an outer material 31 surrounding the parts of the annular substrate 1 at two ends of the opening 10, and an inner material 32 disposed in the outer material 31, and the inner material 32 is not in contact with both ends of the opening 10, the connecting member 222 connects the inner material 32 of two adjacent annular substrates 1, and the connecting element 3 and the connecting member 222 form the second connection part 22. The outer material 31 only is used for connecting the annular substrate 1 at two ends of the opening 10 of the annular substrate 1 and is made of non-conductive material, while the inner material 32 is made of conductive material and is used for electrically connecting with the connecting member 222. Moreover, the conductive inner material 32 is also electrically connected with the LED chips 100 on the annular substrate 1 by the connecting wire 200 to achieve various connection and control modes. Each annular substrate 1 is provided with at least one opening 10, some of the openings 10 are only used to form an open circuit, some of the openings are connected by the connecting element 3. When the opening 10 is provided, the ends of the opening 10 of the annular substrate 1 is acted as one of the electrode leads of the substrate.

Figure 7:
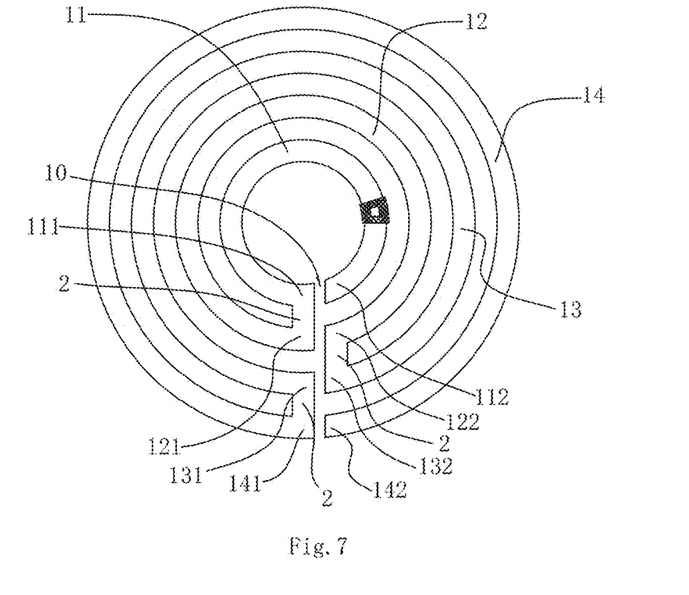
FIG. 7 is a schematic view of an LED substrate and package according to the fifth embodiment of the present invention.

FIG. 7 is a schematic view of an LED substrate and package according to a fifth embodiment. The substrate in this embodiment comprises a plurality of concentric and sequentially spaced annular substrates 1, each of the annular substrates is a circular ring, each of the annular substrates 1 in the first to third embodiments is a closed ring, and the annular substrate 1 in the fourth embodiment is provided with the opening 10, but the second connection part 22 is provided on the opening 10 to connect the two ends of the opening 10 of the annular substrate 1. In this embodiment, each annular substrate 1 has an opening 10, the opening 10 of each annular substrate 1 is located at a corresponding position. A connection part 2 is provided between the adjacent annular substrates 1, and the connection part 2 connects one end of the annular substrate 1 at the opening 10. For example, as shown in FIG. 7, four annular substrates 1 spaced apart from each other are respectively a first annular substrate 11, a second annular substrate 12, a third annular substrate 13 and a fourth annular substrate 14, and each of annular substrates 1 has an opening 10. The opening 10 of the first annular substrate 11 has a first end 111 and a second end 112, and the opening 10 of the second annular substrate 12 has a first end 121 and a second end 122, and the opening 10 of the third annular substrate 13 has a first end 131 and a second end 132. The opening 10 of the fourth annular substrate 14 has a first end 141 and a second end 142. A connection part 2 is connected between the first end 111 of the opening 10 of the first annular substrate 11 and the first end 121 of the opening 10 of the second annular substrate 12; a connection part 2 is connected between the second end 122 of the opening 10 of the second annular substrate 12 and the second end 132 of the opening 10 of the third annular substrate 13; and a connection part 2 is connected between the first end 131 of the opening 10 of the third annular substrate 13 and the first end 141 of the opening 10 of the fourth annular substrate 14. That is, the connection part 2 between the adjacent annular substrates 1 sequentially connects the plurality of annular substrates 1 from end to end. That is to say, the connection parts 2 between every two adjacent annular substrates 1 are not connected to each other and are not in the same position. That is, the connection part connects one end of the opening of the two adjacent annular substrates, and the two ends of the opening 10 of each annular substrate 1 are respectively connected to the ends of the openings 10 of two annular substrates 1 adjacent to said annular substrate through different connection parts.

Figure 8:
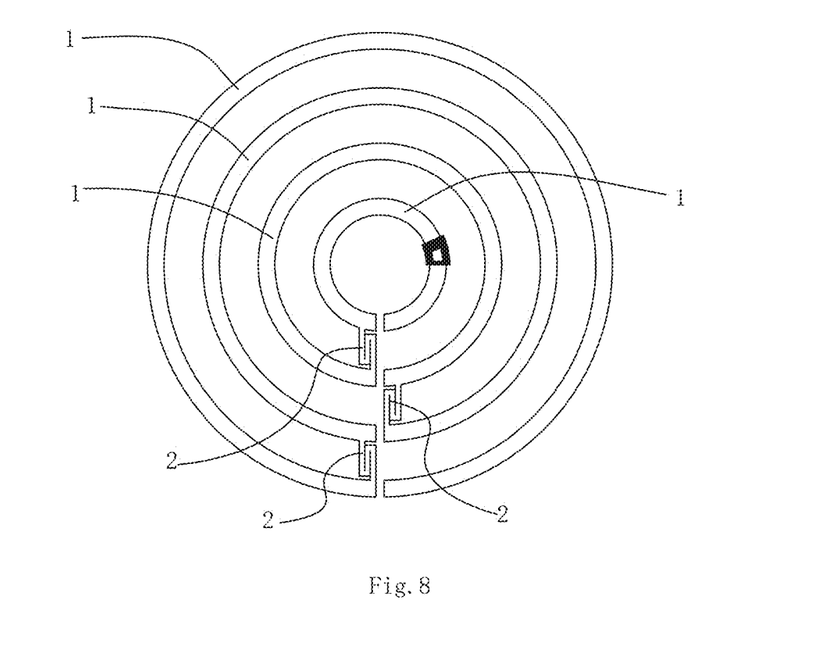
FIG. 8 is a schematic view of an LED substrate and package according to the sixth embodiment of the present invention.

FIG. 8 is a schematic view of an LED substrate and package according to the sixth embodiment, in which the configuration of substrate is substantially the same as that in the fifth embodiment, except that the connection part 2 is a bending structure, which makes the stretching and reshaping of the connection part 2 more convenient, and the connection part is not easy to be damaged. Moreover, when a plurality of annular substrates are in the same plane, the distance between the annular substrates is smaller, which facilitates the processing and material saving.

Figure 9:
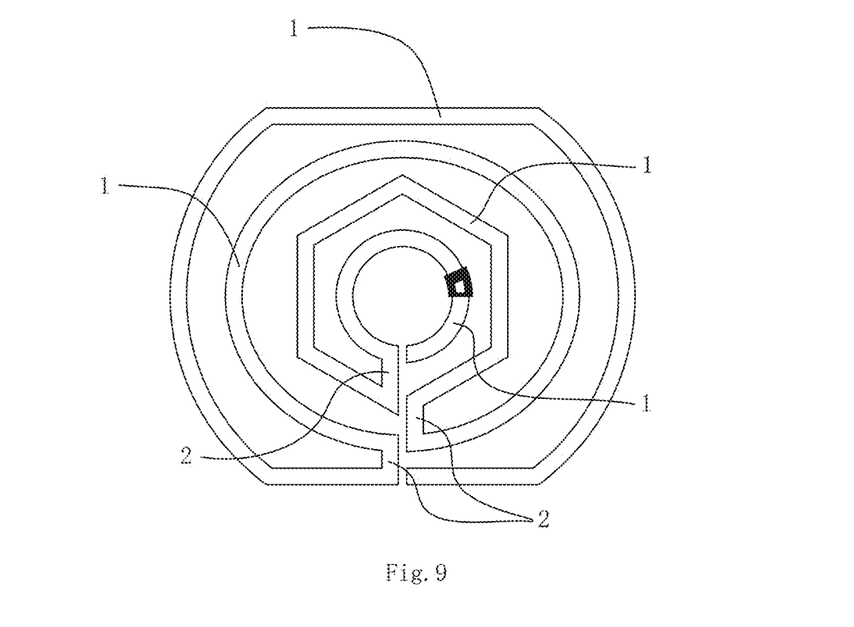
FIG. 9 is a schematic view of an LED substrate and package according to the seventh embodiment of the present invention.

As shown in FIG. 9, the basic structure of an LED substrate and package in the seventh embodiment is the same as that in the fifth and sixth embodiments, except that each of the annular substrates 1 is not necessarily a circular ring structure, and some of the annular substrates 1 are polygonal ring structures, some of the annular substrates are circular ring structures, some of the annular substrates are annular structure composed of several arcs and several straight lines, such as a racetrack, and other irregular annular structures etc. The annular substrates 1 can be selected from a variety of other annular structures, as long as the annular substrates are spaced apart from each other. Moreover, although the annular substrates 1 in the above embodiments are all concentrically arranged, actually as long as the annular substrates 1 are spaced apart from each other, the above functions are also achieved by eccentrically arranging the annular substrates. Furthermore, the above functions are also achieved by arranging concentrically some of the annular substrates, and by eccentrically arranging annular substrates some of the annular substrates. The annular substrates 1 are nested with each other when they are in the same plane.

Figure 10:
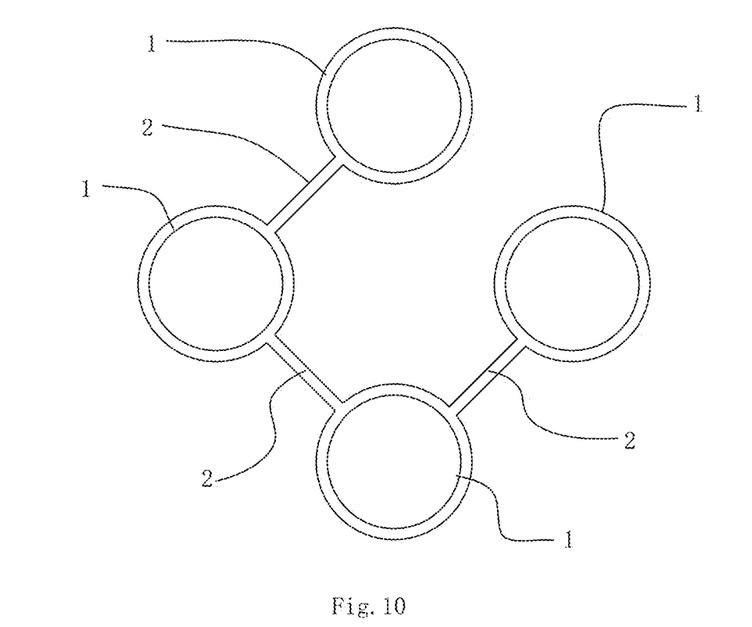
FIG. 10 is a schematic view of an LED substrate and package according to the eighth embodiment of the present invention.

FIG. 10 illustrates an LED substrate and package in the eighth embodiment, which are different from those in the above embodiments. The annular substrates 1 in this embodiment are in the same plane and are spaced apart from each other, except that the annular substrates 1 are not nested with each other, but sequentially separated from each other; every two adjacent annular substrates 1 are connected with each other by a connection part 2. Moreover, each annular substrate 1 is a circular ring and has the same diameter. As long as the connection part 2 is reshaped, the plurality of annular substrates 1 are reshaped into different planes, so as to obtain a multilevel and multi-surface light emitting three-dimensional structure.

Figure 11:
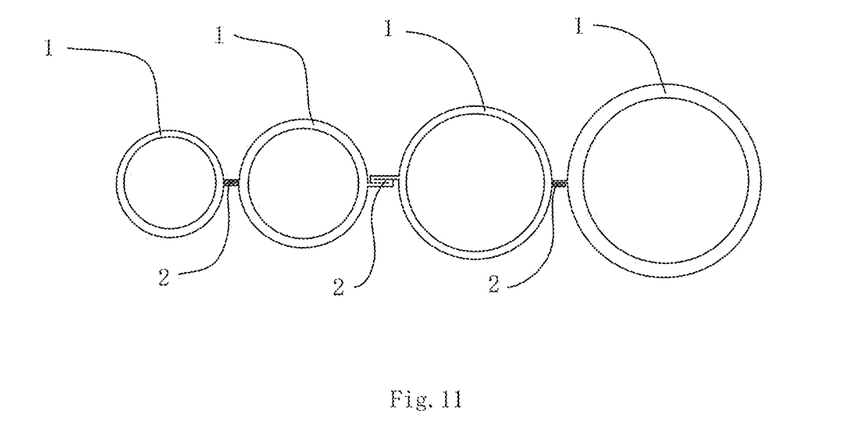
FIG. 11 is a schematic view of an LED substrate and package according to the ninth embodiment of the present invention.

As shown in FIG. 11, in the ninth embodiment, like in the eighth embodiment, the annular substrates 1 are disposed in the same plane and spaced apart from each other, and the annular substrates 1 are not nested with each other, but sequentially separated from each other. Every two adjacent annular substrates 1 are connected to each other by a connection part 2. The ring diameter of the annular substrate 1 sequentially increases. As long as the connection part 2 is reshaped, the plurality of annular substrates 1 are transformed into different planes so as to obtain a multilevel and multi-surface light emitting three-dimensional structure.

Figure 12:
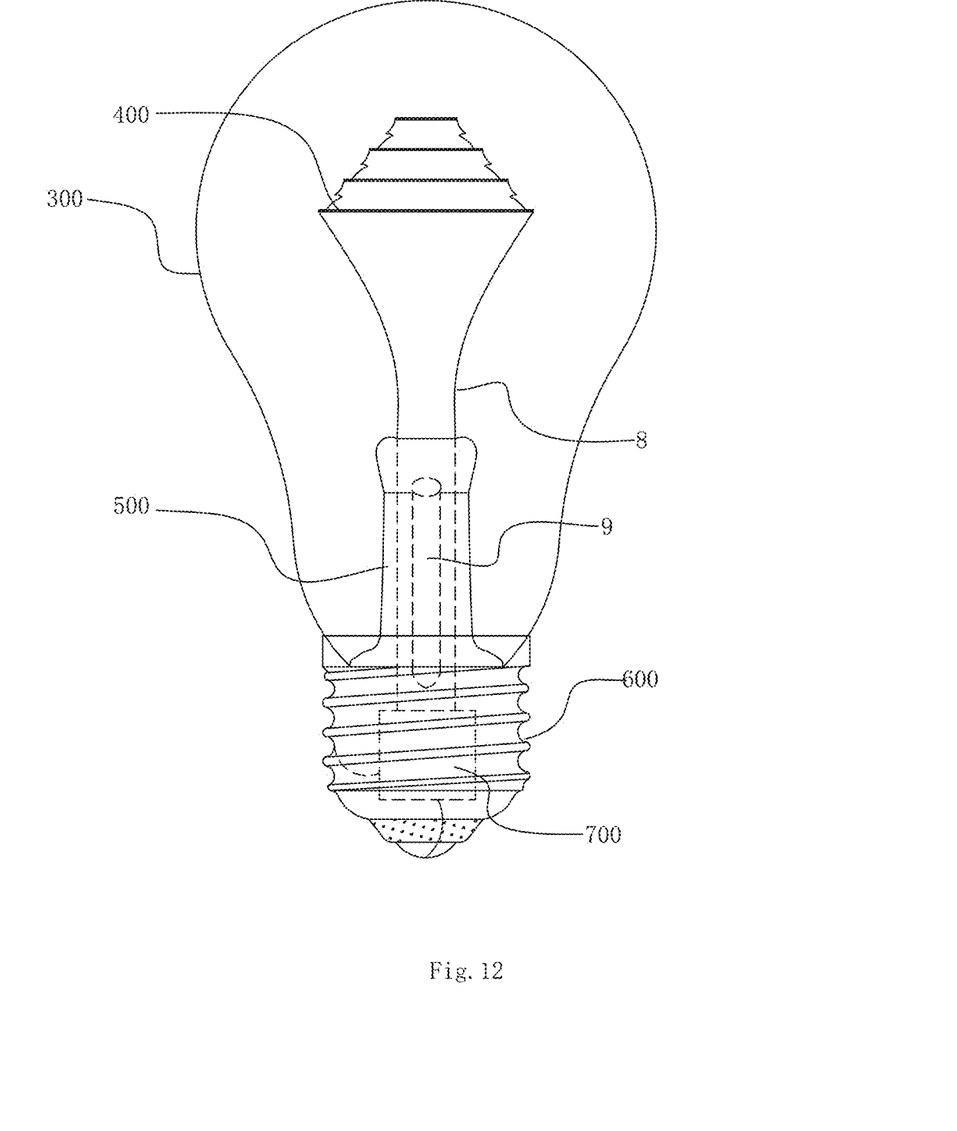
FIG. 12 is a schematic view of an LED bulb according to the first embodiment of the present invention.

FIG. 12 shows an LED bulb according to the first embodiment, which comprises an outer transparent shell 300 and an LED package 400 disposed in the transparent shell 300. A stem 500 with a lead wire 8 and a stem exhaust pipe 9 is disposed in the transparent shell 300, and at least one LED package 400 is fixed on the lead wire 8, the bottom of the transparent shell 300 and the bottom of the stem 500 are fixed on an electrical connector 600. A driver 700 is disposed in the electrical connector 600, and the lead wire 8 is connected to the driver 700. In a sealed space formed by the transparent shell 20, a gas protecting the three-dimensional LED package and facilitating the heat dissipation of the three-dimensional LED package is filled, and the gas is helium gas or hydrogen-helium mixture gas. The transparent shell 300 is a transparent, milky white, frosted, or colored shell, and can also be a shell that is partly reflective or has small prisms and lens. The shape of the transparent shell 300 is one of A-type, G-type, R-type, PAR-type, T-type, candle type or other shapes of existing bulbs. The electrical connector 90 is one of the existing electrical connectors such as E40, E27, E26, E14, and GU etc. The LED package 400 in this embodiment is the LED package in FIG. 1.

Figure 13:
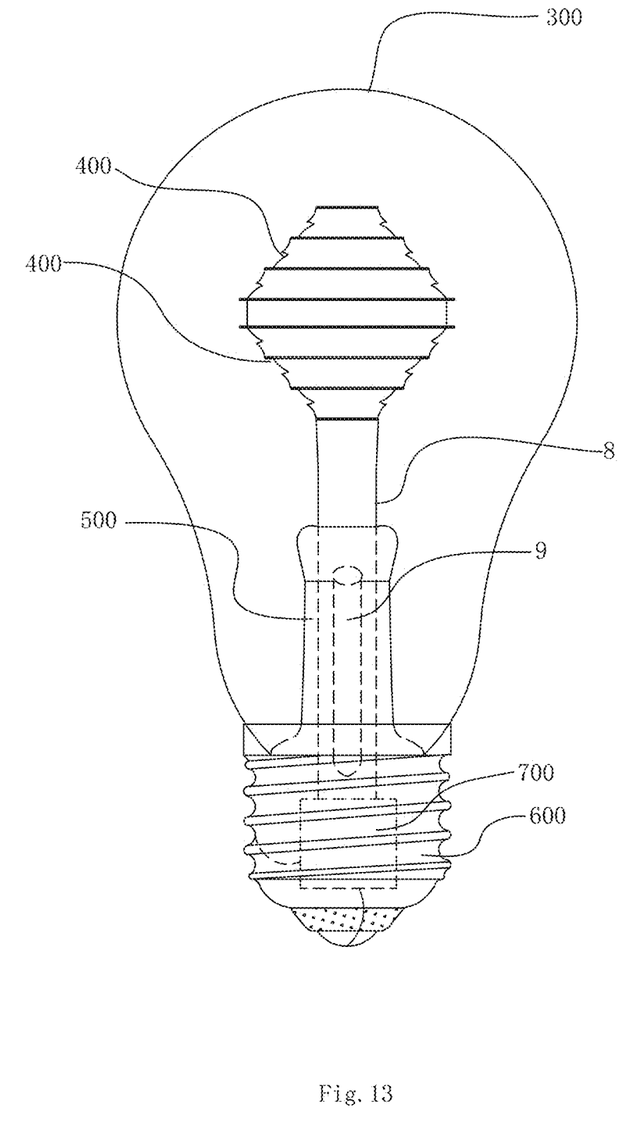
FIG. 13 is a schematic view of an LED bulb according to the second embodiment of the present invention.

FIG. 13 illustrates an LED bulb of the second embodiment, in which the structure of the LED bulb is substantially the same as that in the first embodiment, except that two LED packages 400 are disposed on the lead wire 300, and the two LED packages are arranged oppositely, so that the two LED packages 400 form a three-dimensional shape that gradually increases and gradually decreases from top to bottom and in the radial direction. The two LED packages 400 can be connected by the connection part 2, or be connected by the connecting element 3, and can also be electrically or structurally connected by other connecting mechanism. This structure makes the whole LED bulb have greater light emitting angle, more light emitting levels, and better three-dimensional effect. Moreover, the LED package 400 in this embodiment also is the LED package in the first embodiment.

By means of the multilevel light emitting LED substrate, package and bulb, a planar LED substrate and package can be transformed to be a three-dimensional structure; the manufacturing is convenient, the structure is simple, and it is easy to dispose and control LED chips; moreover, the process efficiency is high, so that the LED package is not easily to be damaged in the process, and the production efficiency and yield are improved.

Although preferred embodiments of the present invention have been described in detail above, it will be apparent to those skilled in the art that various modifications and variations can be made to the present invention. Any modification, equivalent replacement, improvement and the like made within the spirit and principle of the present invention should be included in the protection scope of the present invention.

The invention claimed is:

1. A multilevel light emitting LED substrate comprising a plurality of annular substrates spaced apart from each other, characterized in that, every two adjacent annular substrates among the plurality of annular substrates are connected with each other by using at least one connection part, the plurality of annular substrates are located in different planes to form a three-dimensional structure by stretching and reshaping the connection part, each of the plurality of annular substrates is provided with a disconnected opening, a connecting element is disposed on the opening, the connecting element comprises an outer material wrapping and connecting two ends of the opening, an inner material located in the outer material and without contacting with two ends of the opening, the outer material is made of non-conductive material and the inner material is made of conductive material, the inner material is electrically connected with the LED chips on the annular substrate by a connecting wire.

2. The multilevel light emitting LED substrate according to claim 1, characterized in that there is one connection part between every two adjacent annular substrates, and the connection parts are connected with each other and the positions thereof correspond to each other.

3. The multilevel light emitting LED substrate according to claim 1, characterized in that the plurality of annular substrates is provided with a connecting element, such that the annular substrate forms a broken circuit structure.

4. The multilevel light emitting LED substrate according to claim 1, characterized in that a connecting member is connected between the inner materials of the connecting elements of each annular substrates.

5. The multilevel light emitting LED substrate according to claim 4, characterized in that the connecting member and/or the connection part are/is a bending structure.

6. The multilevel light emitting LED substrate according to claim 1, characterized in that the annular substrate is a polygonal annular structure, a circular ring structure, or an annular structure composed of several arcs and several straight lines.

7. The multilevel light emitting LED substrate according to claim 1, characterized in that the connection part connects one end of the openings of two adjacent annular substrates respectively, and the two ends of the opening of each annular substrate are respectively connected with the ends of the openings of two annular substrates adjacent to said annular substrate by means of different connection parts.

8. The multilevel light emitting LED substrate according to claim 1, characterized in that the plurality of annular substrates are nested with each other, and the plurality of annular substrates are concentrically or eccentrically arranged; or the plurality of annular substrates are arranged next to and separately from each other.

9. A multilayered light emitting LED package, comprising a multilevel light emitting LED substrate, characterized in that a plurality of LED chips are arranged in series and/or in parallel on the annular substrate, the multilevel light emitting LED substrate comprises a plurality of annular substrates spaced apart from each other, every two adjacent annular substrates among the plurality of annular substrates are connected with each other by using at least one connection part, the plurality of annular substrates are located in different planes to form a three-dimensional structure by stretching and reshaping the connection part, each of the plurality of annular substrates is provided with a disconnected opening, a connecting element is disposed on the opening, the connecting element comprises an outer material wrapping and connecting two ends of the opening, an inner material located in the outer material and without contacting with two ends of the opening, the outer material is made of non-conductive material and the inner material is made of conductive material, and the inner material is electrically connected with the LED chips on the annular substrate by a connecting wire.

10. A multilayered light emitting LED bulb having a multilayered light emitting LED package, characterized in that, the multilayered light emitting LED package comprises a multilevel light emitting LED substrate, the multilevel light emitting LED substrate comprises a plurality of annular substrates spaced apart from each other, every two adjacent annular substrates among the plurality of annular substrates are connected with each other by using at least one connection part, the plurality of annular substrates are located in different planes to form a three-dimensional structure by stretching and reshaping the connection part, the multilayered light emitting LED bulb comprises an outer transparent shell and a stem disposed in the transparent shell, the stem is provided with a lead wire on which at least one LED package is fixed, an electrical connector is disposed at the bottom of the transparent shell and the bottom of the stem, a driver is disposed in the electrical connector, and the lead wire is connected to the driver, each of the plurality of annular substrates is provided with a disconnected opening, a connecting element is disposed on the opening, the connecting element comprises an outer material wrapping and connecting two ends of the opening, an inner material located in the outer material and without contacting with two ends of the opening, the outer material is made of non-conductive material and the inner material is made of conductive material, the inner material is electrically connected with the LED chips on the annular substrate by a connecting wire.

* * * * *

UNITED STATES PATENT AND TRADEMARK OFFICE
CERTIFICATE OF CORRECTION

PATENT NO. : 10,269,719 B2  
APPLICATION NO. : 15/757713  
DATED : April 23, 2019  
INVENTOR(S) : Tiehan Ge Page 1 of 1

It is certified that error appears in the above-identified patent and that said Letters Patent is hereby corrected as shown below:

On the Title Page

Inventors, the inventors name should be listed as TIEHAN GE.

Signed and Sealed this  
Twenty-eighth Day of May, 2019

Andrei Iancu  
*Director of the United States Patent and Trademark Office*